United States Patent
Park et al.

(10) Patent No.: US 6,645,682 B2
(45) Date of Patent: Nov. 11, 2003

(54) THINNER FOR RINSING PHOTORESIST AND METHOD OF TREATING PHOTORESIST LAYER

(75) Inventors: Hong-Sick Park, Yongin (KR); Jin-Ho Ju, Seoul (KR); Yu-Kyung Lee, Yongin (KR); Sung-Chul Kang, Seongnam (KR); Sae-Tae Oh, Anseong (KR); Doek-Man Kang, Anseong (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/169,033

(22) PCT Filed: Dec. 8, 2000

(86) PCT No.: PCT/KR00/01429

§ 371 (c)(1),
(2), (4) Date: Jun. 25, 2002

(87) PCT Pub. No.: WO01/48555

PCT Pub. Date: Jul. 5, 2001

(65) Prior Publication Data

US 2003/0091942 A1 May 15, 2003

(30) Foreign Application Priority Data

Dec. 24, 1999 (KR) ......... 1999-62169

(51) Int. Cl.[7] ............ G03F 7/42; G03F 7/40; G03F 7/16; G03F 7/38
(52) U.S. Cl. ......... 430/20; 430/270.1; 430/271.1; 430/272.1; 430/275.1; 430/277.1; 430/278.1; 430/313; 430/317; 430/318; 430/327; 430/331; 510/176
(58) Field of Search .............. 430/327, 331, 430/20, 313, 317, 318, 270.1, 271.1, 272.1, 275.1, 277.1, 278.1; 510/176

(56) References Cited

U.S. PATENT DOCUMENTS

| | | | | |
|---|---|---|---|---|
| 4,853,314 A | * | 8/1989 | Ruckert et al. | 430/191 |
| 4,885,232 A | * | 12/1989 | Spak | 430/326 |
| 4,948,697 A | * | 8/1990 | Durham | 430/165 |
| 4,983,490 A | * | 1/1991 | Durham | 430/169 |
| 5,370,817 A | * | 12/1994 | Weltman et al. | 134/38 |
| 5,763,135 A | * | 6/1998 | Ding et al. | 430/191 |
| 5,964,951 A | * | 10/1999 | Yamamoto et al. | 430/319 |

FOREIGN PATENT DOCUMENTS

| | | | |
|---|---|---|---|
| EP | 529970 | * | 3/1993 |
| EP | 923 112 | * | 6/1999 |
| JP | 07/098502 | * | 4/1995 |
| JP | 07/128867 | * | 5/1995 |

* cited by examiner

Primary Examiner—Richard L. Schilling
(74) Attorney, Agent, or Firm—McGuireWoods LLP

(57) ABSTRACT

A thinner for rinsing photoresist including 50 to 80 wt. % of n-butyl acetate, propylene glycol alkyl ether, and propylene glycol alkyl ether acetate, is provided. The thinner is neither toxic to humans nor ecologically undesirable and has no unpleasant odor. The waste solutions thereof and associated waste water are easily handed so as to render this thinner environmental friendly. Additionally, the photoresist thinner of the present invention has excellent rinsing ability.

9 Claims, 1 Drawing Sheet

THINNER FOR RINSING PHOTORESIST AND METHOD OF TREATING PHOTORESIST LAYER

CROSS REFERENCE TO RELATED APPLICATION

This application is based on application No 99-62169 filed in the Korean Industrial Property Office on Dec. 24, 1999, the content of which is incorporated hereinto by reference.

BACKGROUND OF THE INVENTION (a) Field of the Invention

The present invention relates to a thinner for rinsing photoresist and a method of treating a photoresist layer and, more particularly, to a thinner for rinsing an edge of photoresist layer on a substrate, such as a liquid crystal display substrate or a semiconductor substrate and a method of treating a photoresist layer using the thinner.

(b) Description of the Related Art

For producing tiny circuit patterns such as those used in liquid crystal display (LCD) circuits or semiconductor integrated circuits, a photoresist composition including a polymer resin, a photosensitive compound and a solvent is uniformly coated or applied on an insulator layer or a conductive metal layer on a substrate and the coated or applied substrate is then soft-baked to evaporate the solvent. The soft-baked substrate is selectively exposed to some form of radiation, such as ultraviolet light, electrons, or X-rays, and the exposed substrate is then hard-baked. Next, the hard-baked substrate is developed to produce a desired pattern. The developed substrate is etched with a mask to remove the insulator layer or the conductive metal layer and the residual photoresist layer is removed to complete the transfer of the tiny pattern onto the substrate surface.

Since the photoresist layer on the edge of the substrate is less uniform than in the substrate central areas, the uneven of the photoresist layer or beads should be removed from a wafer and the substrate should then be cleaned.

Both mechanical and chemical processes are known for the removal of the uneven excess photoresist or beads, but these processes leave much to be desired. If the cured coating is mechanically stripped as by scraping, the removal of the material is almost invariable accompanied by some physical damage. Alternatively, the cured coating is chemically stripped as by stripping, cleaning or thinning with a thinner The thinner may generally be methyl isobutyl ketone (MIBK).

This compound has good ability to rinse photoresist, but it is toxic to humans and the environment and is restricted in its use by ISO 14000. Accordingly, there is a need to replace methylisobuthylketone with other materials.

U.S. Pat. No. 4,983,490 discloses a photoresist treating composition. The composition includes 1 to 10 parts by weight of propylene glycol alkyl ether (PGME) and 1 to 10 parts by weight of propylene glycol alkyl ether acetate (PGMEA). The composition, however, has poor ability to rinse photoresist and has a lower photoresist solubility and evaporation rate than MIBK.

There is still a need for a thinner for rinsing photoresist which is not toxic to humans, ecologically undesirable, and has no unpleasant odor, and which can also quickly and completely remove cured or uncured photoresist layer from the substrate without resulting in the contamination thereof and damage.

SUMMARY OF THE INVENTION

It is an object of the present invention to provide a thinner for rinsing photoresist, which is not toxic to humans and has no unpleasant odor.

It is another object to provide a thinner for rinsing photoresist, which is environmentally friendly so that the waste solution and waste water thereof is easily treated.

It is still another object to provide a thinner for rinsing photoresist, which exhibits excellent ability to rinse photoresist layer.

It is still yet another object to provide a thinner for rinsing photoresist, which can be stored at room temperature and can be used without changing conventional equipment and production conditions.

It is also another object to provide a method of treating photoresist layer using the thinner.

These and other objects may be achieved by a thinner for rinsing photoresist including 50 to 80 wt % of n-butyl acetate, propylene glycol alkyl ether, and propylene glycol alkyl ether acetate.

In order to achieve these objects and others, the present invention provides a method of treating a photoresist layer. In this method, a photoresist composition is coated on a substrate. The photoresist composition includes a polymer compound, a photosensitive compound and a solvent. The photoresist layer is then rinsed with a thinner for rinsing photoresist. The thinner includes 50 to 80 wt % of n-butyl acetate, propylene glycol alkyl ether, and propylene glycol alkyl ether acetate. It is preferred that a soft-baking step is further performed by heating the photoresist coated on the substrate before the rinsing step.

The present invention further includes a method of producing a tiny circuit pattern for a liquid crystal display circuit or a semiconductor circuit. In this method, a photoresist composition is coated on a substrate for a liquid crystal display or a semiconductor. The photoresist composition includes a polymer compound, a photosensitive compound, and a solvent. The photoresist composition on the substrate is heated to evaporate the solvent from the composition and the heating step is called a "soft-baking step". As the result, a photoresist layer is formed on the substrate. The photoresist layer on the substrate is selectively exposed to some form of radiation, such as ultraviolet light, electrons, or X-rays through a mask to produce a pattern. The exposed substrate is then dipped into a developing aqueous solution to dissolve the exposed or unexposed photoresist layer and this step is called a "developing step". The developed photoresist layer is heat-treated and the heating step is called a "hard-baking step". Next, the hard-baked substrate is etched to produce a circuit pattern and to stripe the residual photoresist. The photoresist layer is rinsed using a thinner for rinsing photoresist after any one of the steps of coating, soft-baking, exposing, developing, or hard-baking. The thinner includes 50 to 80 wt % of n-butyl acetate, propylene glycol alkyl ether, and propylene glycol alkyl ether acetate

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, wherein.

DETAILED DESCRIPTION OF THE INVENTION

Figure 1:
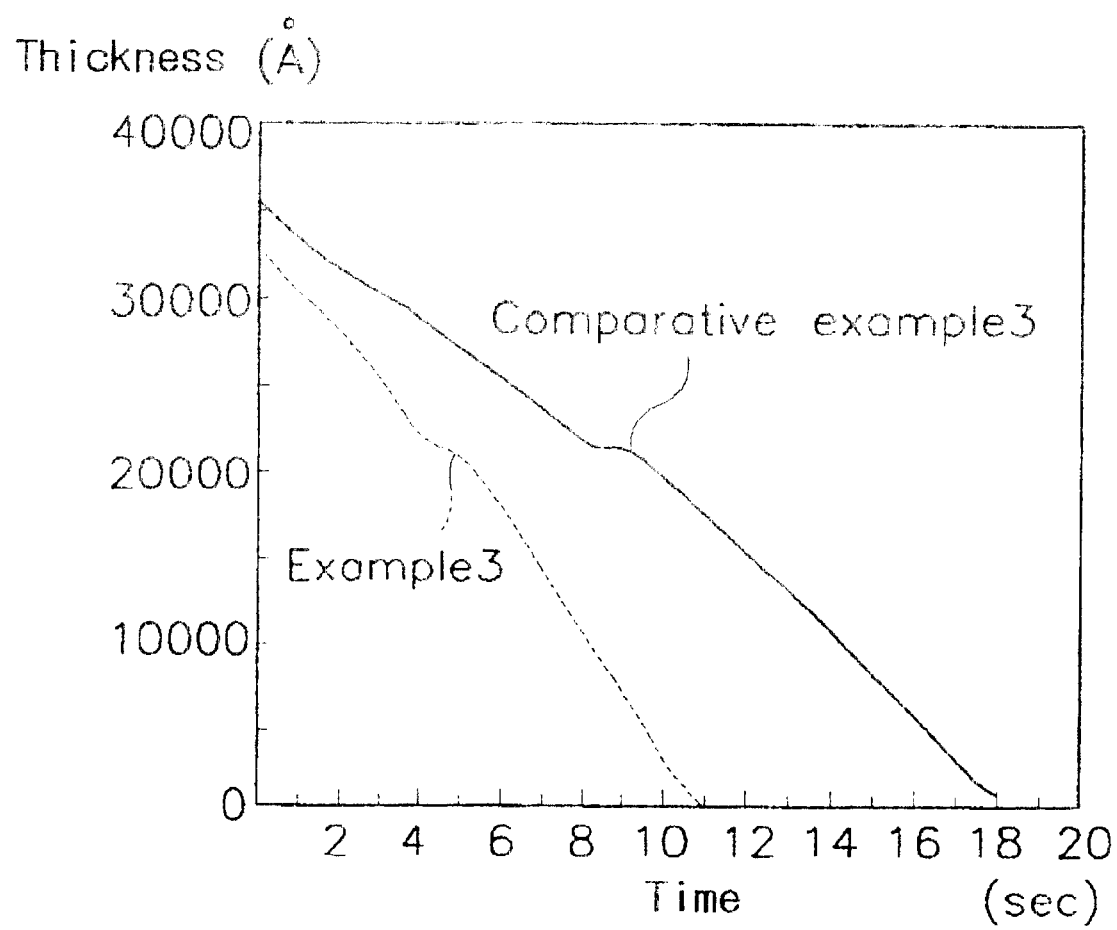
FIG. 1 is a graph illustrating dissolution rate of thinners according to one embodiment and a comparative example of the present invention.

A thinner of this invention includes n-butyl acetate, propylene glycol alkyl ether, and propylene glycol alkyl ether acetate. The thinner includes preferably, 50 to 80 wt %, more preferably 60 to 70 wt % of n-butyl acetate, preferably 15 to 30 wt %, more preferably 20 to 30 wt % of propylene glycol alkyl ether and preferably 5 to 20 wt %, more preferably 5 to 15 wt % of propylene glycol alkyl ether acetate.

If the amount of n-butyl acetate is less than 50 wt %, the evaporation rate and photoresist solubility is reduced. Whereas, if the amount thereof is more than 80 wt %, the evaporation rate and ability to permeate is increased too much. If the amount of propylene glycol alkyl ether is less than 15 wt %, the evaporation rate and ability to permeate is increased too much. Whereas, if the amount thereof is more than 30 wt %, the evaporation rate and photoresist solubility is reduced. If the amount of propylene glycol alkyl ether acetate is less than 5 wt %, the evaporation rate and ability to permeate is increased too much. Whereas, if the amount thereof is more than 20 wt %, the evaporation rate and photoresist solubility is reduced.

Toxicity tests and ignition and explosive tests for methyl isobutyl ketone (MIBK) (conventionally used as a thinner), n-butyl acetate (n-BA), propylene glycol alkyl ether (PGME), and propylene glycol alkyl ether acetate (PGMEA) that are used for the thinner of the present invention were performed and the results are presented in Tables 1 and 2.

TABLE 1

Toxicity test

| Solvent | TWA [ppm] | STEL [ppm] | Toxicological Information |
|---|---|---|---|
| MIBK | 50 | 75 | $LD_{50}$/oral/mouse: 2080 mg/kg<br>$LD_{50}$/dermal/rabbit: 20 mg/kg or more<br>$LD_{50}$/inhal/mouse: 23300 mg/m$^3$<br>$LC_{lo}$/inhal/rat: 4000 ppm |
| n-BA | 150 | 200 | $LD_{50}$/oral/rat: 14000 mg/kg<br>$LD_{50}$/inhal/rat: 2000 ppm (4 hrs) |
| PGME | 100 | N. A. | $LD_{50}$/oral/rat: 6600 mg/kg<br>$LD_{50}$/dermal/rat: 13000 mg/kg<br>$LC_{50}$/inhal/rat: 5000 ppm (7 hrs) |
| PGMEA | 100 | N. A. | $LD_{50}$/oral/rat: 8532 mg/kg<br>$LD_{50}$/dermal: 5000 mg/kg<br>$LC_{50}$/ingal/rat: 4245 ppm (6 hrs) |

TWA (time weighted average): average concentration to which nearly all employees could be repeatedly exposed without adverse effects for 8 hours a day and for 40 hours a week STEL (short term exposure limit): concentration to which employees can be exposed for short term (15 minutes) without inducing narcosis or stimulation, either of which can lead to accidents and a decreases of work efficiency.

$LD_{50}$ (lethal dose 50): the dose of a substance which is fatal to 50% of the test animals $LC_{lo}$ (Lethal Concentration Low): the lowest concentration of a substance in air which has been reported to have caused death in humans or animals for periods of exposure which are less than 24 hours N.A.: non-available

TABLE 2

Ignition and Explosive Tests

| Solvent | Evaporation rate | Vapor pressure [mmHg]/ temperature [° C.] | Flash point [° C.] | Boiling point [° C.] | Ignition point [° C.] | Explosive limit [%] |
|---|---|---|---|---|---|---|
| MIBK | 1.57 | 16/20 | 18 | 115 | 449 | 1.4 to 7.5 |
| n-BA | 0.98 | 7.8/20 | 22 | 126 | 425 | 1.7 to 15 |
| PGME | 0.66 | 6.7/20 | 32 | 120 | N.A. | 2.7 to 11.8 |
| PGMEA | 0.34 | 3.8/20 | 42 | 146 | 354 | 1.5 to 7 |

In Table 2, the evaporation rate is indicated by a relative value by setting the evaporation rate of butyl acetate to be equal to one, and the explosive limit is indicated by the concentration range at which flame propagation occurs under a suitable firing source. As shown in Tables 1 and 2, n-BA used in the present invention shows superior biological and physical safety characteristics to those of MIBK used in the conventional process and shows the same or as good biological and physical safety characteristics as those of PGME or PGMEA.

A photoresist composition for producing a photoresist layer is well known in the related art. A photoresist composition includes a polymer compound, a photosensitive compound, and a solvent, with a good example thereof being a, novolak resin. Useful photosensitive diazide-based compounds may be produced by reacting polyhydroxy benzophenon with diazide-based compounds, such as 1,2-naphtoquinonediazide or 2-diazo-1-naphtol-5-sulfonic acid. The solvent in the photoresist composition generally includes xylene, butyl acetate, cellosolve acetate, propylene glycol alkyl ether acetate, or a mixture thereof.

The photoresist composition may be coated on a semiconductor or a LCD substrate by general coating techniques such as immersing, spraying, rotating and spinning steps. Examples of the substrate materials are silicone, aluminum, silicone dioxide, silicone nitride, tantalum, copper, polysilicon, ceramic, and various polymerable resins. When the photoresist is coated on the substrate, particularly by spin coating, the uneven portions, such as beads on the edge of the substrate, are caused due to photoresist lumps.

The thinner for rinsing the photoresist of the present invention is sprayed on the substrate such that beads are dissolved and a uniform photoresist layer can be produced. Alternatively, the photoresist layer is dipped into the thinner such that the thickness of the photoresist layer can be controlled. The rinsing step also may be performed after a subsequent soft-baking step or hard-baking step.

The coated substrate is heated at 20 to 100° C. to perform a soft-baking step. This step permits the evaporation of the solvent without pyrolysis of a solid component in the photoresist composition, and is performed until the solvent is mostly evaporated in order to produce a thin coating layer of the photoresist composition on the substrate.

Next, the substrate coated with the photoresist layer is selectively exposed to a form of radiation, such as ultraviolet light, electrons, or X-rays using a suitable mask to obtain a desirable pattern. The exposed substrate is then dipped into an aqueous alkaline developing solution until either the exposed or unexposed photoresist layer (depending on the type of photoresist) is all or almost entirely dissolved. The exposed or unexposed photoresist removed substrate is then taken out from the developing solution. The resulting substrate is then heat-treated to improve adhesion and to increase chemical resistance of the photoresist layer and this step is called hard-baking step. The developed substrate is treated with an etchant or with vapor plasma to etch the exposed portion and the residual photoresist protects the substrate regions which it covers. The photoresist layer is removed from the etched substrate using a stripper to complete the transfer the pattern onto the substrate surface.

The following examples further illustrate the present invention.

Example 1

Comparative Example 1

Two wafers coated with photoresist were dipped into a thinner composition and a thinner. The thinner composition included 65 wt % of n-BA, 24 wt % of PGME, and 11 wt % of PGMEA, and the thinner was composed of MIBK. The complete photoresist removal times (i.e., no trace of photoresist existing after drying) were measured and the results are presented in Table 3.

TABLE 3

|  | Example 1 | Comparative example 1 |
| --- | --- | --- |
| Complete photoresist removal time [sec] | 18 | 18 |

Example 2

Comparative Example 2

1.7 g of thinner composition and 1.7 g of thinner were respectively poured into two aluminum dishes and allowed to stand for 32 minutes. The thinner composition included 65 wt % of n-BA, 24 wt % of PGME, and 11 wt % of PGMEA and the thinner was composed of MIBK. The residual weight of the thinner composition and the thinner were respectively measured, and the results are shown in Table 4.

TABLE 4

|  | Example 2 | Comparative example 2 |
| --- | --- | --- |
| Residual weight after 32 minutes (wt %) | 6 | 0 |

As shown in Tables 3 and 4, the thinner composition of the present invention has a lower volatility and has similar photoresist solubility when compared with MIBK.

Example 3

Comparative Example 3

The photoresis composition was coated on two Si wafers and a soft-baking step was performed at 140° C. for 90 seconds to obtain a photoresist layer with a thickness of 2.09 μm on the wafer. The resulting wafers were dipped into a thinner composition and a thinner, respectively. The thinner composition included 65 wt % of n-NA, 24 wt % of PGME, and 11 wt % of PGMEA and the thinner was composed of MIBK. The thickness of the layer according to the time was measured and the results are shown in FIG. 1. As shown in FIG. 1, the photoresist thinner of Example 3 shows good photoresist solubility and low build-up and permeation properties when compared with MIBK.

Example 4

Comparative Example 4

A photoresist composition was coated on a tetragonal glass substrate for a liquid crystal display device and a soft-baking step was performed to produce a photoresist layer. A edge portion of the photoresist layer was rinsed with a thinner composition including 65 wt % of n-BA, 24 wt % of PGME, and 11 wt % of PGMEA, and with MIBK, respectively. The profile of the photoresist produced on four sides of the photoresist layer (correspond to observation points 1, 2, 3 and 4) was scanned with a surface scanner and the build-up and permeation of the photoresist layer was determined. The results of this scanning are presented in Table 5. The build-up value is indicated by height of the edge portion in the rinsed photoresist layer and the permeation value is indicated by horizontal distance from the edge to a portion of which the surface appearance is modified by the permeation of the thinner.

TABLE 5

| | Example 6 | | Comparative example 6 | |
| --- | --- | --- | --- | --- |
| Observation point | Build-up [μm] | Permeation [μm] | Build-up [μm] | Permeation [μm] |
| 1 | 3.33 | 4.02 | 3.49 | 4.20 |
| 2 | 1.30 | 2.48 | 1.65 | 2.54 |
| 3 | 2.48 | 2.68 | 1.80 | 2.98 |
| 4 | 1.52 | 1.98 | 2.58 | 2.20 |
| Average | 2.16 | 2.79 | 2.38 | 2.98 |

The photoresist thinner of Example 6 shows a lower build-up and permeation properties when compared with MIBK. The results indicate that the thinner of the present invention can rinse the edge portion of the photoresist layer without resulting in a modification thereof.

The thinner for rinsing photoresist of the present invention is neither toxic to humans nor ecologically undesirable and has no unpleasant odor. The waste solutions thereof and associated waste water are easily handed so as to render this thinner environmental friendly. Additionally, the photoresist thinner of the present invention has excellent rinsing ability.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thinner for rinsing photoresist comprising:
   50 to 80 wt % of n-butyl acetate;
   propylene glycol alkyl ether; and
   propylene glycol alkyl ether acetate.

2. The thinner of claim 1 wherein the amount of n-butyl acetate is 50 to 80 wt % based on the total composition, the amount of propylene glycol alkyl ether is 15 to 30 wt % based on the total composition, and the amount of propylene glycol alkyl ether acetate is 5 to 20 wt % based on the total composition.

3. A method of treating a photoresist layer, comprising the steps of:

coating a photoresist composition on a substrate, the photoresist composition including a polymer compound, a photosensitive compound, and a solvent;

rinsing the photoresist layer with a thinner for rinsing photoresist, the thinner including 50 to 80 wt % of n-butyl acetate, propylene glycol alkyl ether, and propylene glycol alkyl ether acetate n-butyl acetate.

4. The method of claim 3 further comprising a step of soft-baking before the rinsing step, the soft-baking step being performed by heating the photoresist layer on the substrate.

5. A method of producing a liquid crystal display or semiconductor circuit, comprising the steps of:

(a) coating a photoresist composition on a substrate for a liquid crystal display or a semiconductor, the photoresist composition including a polymer compound; a photosensitive compound, and a solvent (b) soft-baking, wherein the coated substrate is heated to evaporate the solvent from the composition and to produce a photoresist layer on the substrate;

(c) selectively exposing the soft-baked substrate through a mask to produce a pattern;

(d) developing, wherein the exposed substrate is dipped into a developing aqueous solution to dissolve an exposed or unexposed photoresist layer (e) hard-baking, wherein the developed photoresist layer is heat-treated;

(f) etching the hard-baked substrate to produce a circuit pattern and to strip the residual photoresist; and (g) rinsing the photoresist layer using a thinner for rinsing photoresist after any one step of (a) to (e) steps, the thinner including 50 to 80 wt % of n-butyl acetate, propylene glycol alkyl ether, and propylene glycol alkyl ether acetate.

6. The method of claim 5 wherein the rinsing step is performed by spraying the thinner to the photoresist layer to remove an edge of the photoresist layer.

7. The method of claim 5 wherein the rinsing step is performed by dipping the photoresist layer into the thinner to control the thickness of the photoresist layer.

8. The method of claim 5 wherein the coating step is performed by dipping the substrate in the composition, or by spraying or spin-coating the composition on the substrate.

9. The method of claim 5 wherein the substrate is selected from the group consisting of silicone, aluminum, silicon dioxide, silicon nitride, tantalum, copper, polysilicon, ceramic, and polymerizable resin.

* * * * *